(12) United States Patent
Cheon et al.

(10) Patent No.: US 12,324,094 B2
(45) Date of Patent: Jun. 3, 2025

(54) COPPER CLAD LAMINATE FILM AND ELECTRONIC DEVICE INCLUDING SAME

(71) Applicant: TORAY ADVANCED MATERIALS KOREA INC., Gyeongsangbuk-do (KR)

(72) Inventors: Jong Hun Cheon, Gyeongsangbuk-do (KR); Ha Soo Lee, Gyeongsangbuk-do (KR); Jong Yong Park, Gyeongsangbuk-do (KR)

(73) Assignee: Toray Advanced Materials Korea Inc., Gyeongsangbuk-do (KR)

( * ) Notice: Subject to any disclaimer, the term of this patent is extended or adjusted under 35 U.S.C. 154(b) by 215 days.

(21) Appl. No.: 18/080,897

(22) Filed: Dec. 14, 2022

(65) Prior Publication Data

US 2023/0199947 A1 Jun. 22, 2023

(30) Foreign Application Priority Data

Dec. 20, 2021 (KR) .......................... 10-2021-0183083

(51) Int. Cl.
| | |
|---|---|
| *H05K 1/03* | (2006.01) |
| *B32B 7/12* | (2006.01) |
| *B32B 15/08* | (2006.01) |
| *B32B 15/20* | (2006.01) |
| *C23C 14/20* | (2006.01) |

(Continued)

(52) U.S. Cl.
CPC ............ *H05K 1/0393* (2013.01); *H05K 1/09* (2013.01); *H05K 3/025* (2013.01); *H05K 3/384* (2013.01); *B32B 7/12* (2013.01); *B32B 15/08* (2013.01); *B32B 15/20* (2013.01); *C23C 14/20* (2013.01); *H05K 2201/0154* (2013.01); *H05K 2201/0355* (2013.01)

(58) Field of Classification Search
None
See application file for complete search history.

(56) References Cited

U.S. PATENT DOCUMENTS

| | | | |
|---|---|---|---|
| 5,112,462 A * | 5/1992 | Swisher | H05K 3/388 427/322 |
| 6,171,714 B1 * | 1/2001 | Bergkessel | C23C 14/562 428/626 |

(Continued)

FOREIGN PATENT DOCUMENTS

| | | | | |
|---|---|---|---|---|
| CN | 113421697 A | * | 9/2021 | ............ C23C 14/20 |
| JP | 04297427 A | | 10/1992 | |

(Continued)

OTHER PUBLICATIONS

Darwent—Dissociation constants—nbsnsrds31—1970 (Year: 1970).*

(Continued)

*Primary Examiner* — John Vincent Lawler
(74) *Attorney, Agent, or Firm* — Snell & Wilmer L.L.P.

(57) ABSTRACT

Disclosed are a copper-clad laminate film and an electronic device including the same. The copper-clad laminate film includes a fluorine-containing substrate, a tie layer disposed on the fluorine-containing substrate, and a copper layer disposed on the tie layer, wherein the tie layer may be a metal layer or metal alloy layer including a metal of a metal-oxygen (M-O) bond dissociation energy of 400 kJ/mol or more, and the tie layer may have a thickness of about 10 nm to about 100 nm.

10 Claims, 2 Drawing Sheets

(51) Int. Cl.
 *H05K 1/09* (2006.01)
 *H05K 3/02* (2006.01)
 *H05K 3/38* (2006.01)

(56) References Cited

U.S. PATENT DOCUMENTS

| | | | |
|---|---|---|---|
| 8,568,899 B2 | 10/2013 | Kohiki et al. | |
| 11,370,200 B2 | 6/2022 | Hosoda et al. | |
| 2007/0141310 A1* | 6/2007 | Song | B32B 27/304 |
| | | | 428/209 |
| 2010/0021649 A1 | 1/2010 | Song et al. | |
| 2010/0221563 A1* | 9/2010 | Kohiki | C23C 28/021 |
| | | | 205/187 |

FOREIGN PATENT DOCUMENTS

| | | | | |
|---|---|---|---|---|
| JP | H06/143491 A | * | 5/1994 | ............. B23B 15/01 |
| JP | 2003127275 A | * | 5/2003 | ............. B32B 15/08 |
| TW | 201032680 A | * | 9/2010 | ............. B32B 15/08 |
| TW | 201414382 A | | 4/2014 | |
| WO | 2021166930 A1 | | 8/2021 | |

OTHER PUBLICATIONS

Sugimoto—JP H06-143491 A—Jap D1+KR D1—MT—conductive laminated film—1994 (Year: 1994).*
Okamoto—TW 201032680 A—MT—fluoro-imide-fluoro + copper w—sputter metal—2010 (Year: 2010).*
Shen—CN 113421697 A—MT—fluorine-polyimide blend—nickel-copper—2021 (Year: 2021).*
PTable.com—Periodic Table—Nov. 20, 2023 (Year: 2023).*
Katsuki—JP 2003-127275 A—MT—clad laminate w- various metals as tie layers—2003 (Year: 2003).*
TIPO; Office Action dated Jan. 4, 2024 in Application No. 111148963.

* cited by examiner

COPPER CLAD LAMINATE FILM AND ELECTRONIC DEVICE INCLUDING SAME

CROSS-REFERENCE TO RELATED APPLICATION

This application is based on and claims priority under 35 U.S.C. § 119 to Korean Patent Application No. 10-2021-0183083, filed on Dec. 20, 2021, in the Korean Intellectual Property Office, the disclosure of which is incorporated by reference herein in its entirety.

BACKGROUND

1. Field

The disclosure relates to a copper-clad laminate film and an electronic device including the same.

2. Description of the Related Art

A copper-clad laminate film is a laminated body of a substrate and a conductive copper foil. The use of copper-clad laminate films has been increasing as electronic devices have gotten smaller in size and lighter in weight. In recent years, advancements in 5G mobile communication devices allow signal transmission rates in GHz bandwidths to become commonplace. In line with such a trend of signals having increasingly higher frequencies, efforts are underway to improve dielectric characteristics of substrates used in printed circuits or antenna elements at high frequencies. To meet such a demand, methodology of forming a coating layer on a substrate surface is used. However, the substrate having such a coating layer formed may cause a decrease in the coatability of substrate surface and the room-temperature adhesion and/or high-temperature adhesion between the substrate and a copper foil. As a result, pattern etching properties and chemical resistance in acidic or alkaline conditions may deteriorate. Accordingly, there still is a demand for a copper laminate film which has improved dielectric characteristics at high frequencies, coatability of substrate surface and also has excellent room-temperature adhesion and high-temperature adhesion between the substrate and the copper foil.

SUMMARY

Provided is a copper-clad laminate film having improved dielectric characteristics at high frequencies, coatability on a substrate surface, and adhesion between the substrate and a copper foil at room temperature and high temperature.

Provided is an electronic device including the copper-clad laminate film.

Additional aspects will be set forth in part in the description which follows and, in part, will be apparent from the description, or may be learned by practice of the presented embodiments of the disclosure.

According to an aspect of the disclosure, a copper-clad laminate film includes
  a fluorine-containing substrate,
  a tie layer disposed on the fluorine-containing substrate, and
  a copper layer positioned on the tie layer,
  wherein the tie layer is a metal layer or a metal alloy layer including a metal having a metal-oxygen (M-O) bond dissociation energy of 400 kJ/mol or more, and
  the tie-layer has a thickness of about 10 nm to about 100 nm.

A water contact angle with respect to the fluorine-containing substrate may be 120° or less.

A diiodomethane contact angle with respect to the fluorine-containing substrate may be 90° or less.

The fluorine-containing substrate may have a surface energy of about 11 dyne/cm to about 25 dyne/cm.

A fluorine content of a surface of the fluorine-containing substrate may be about 60 atom % to about 75 atom %.

The tie layer may include one or more metal or metal alloy selected from among W, Ti, Sn, Cr, Al, and Mo.

The tie layer may further include Ni, and the content of the Ni may be 50 wt % or less.

Peel strength of the copper seed layer and the copper plating layer with respect to the polyimide-based substrate having the fluorine layer disposed thereon, measured after leaving at room temperature (25° C.) for 3 days, may be 0.65 kgf/cm or more.

Peel strength of the copper seed layer and the copper plating layer with respect to the polyimide-based substrate having the fluorine layer disposed thereon, as measured after two or more heat-treatments at 150° C. or higher and being left for 1 day, may be 0.35 kgf/cm or more.

The copper plating layer may have a thickness of 12 μm or less.

According to another aspect,
  an electronic device includes the above-described copper-clad laminate film.

The electronic device may include an antenna device or an antenna cable.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
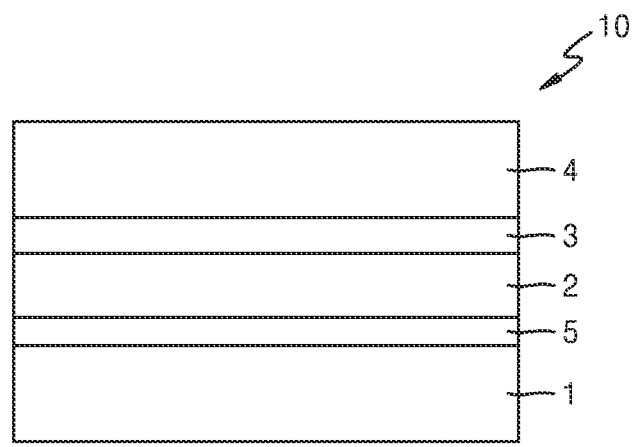
FIG. 1 is a cross-sectional schematic diagram of a copper-clad laminate film according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinbelow, a copper-clad laminate film and an electronic device including the same will be described in greater detail with conjunction with examples and drawings of the present disclosure. The following examples are for illustrative purposes only to describe the present inventive concept in greater detail, and it will be apparent to those skilled in the art that these examples should not be construed as limiting the scope of the present inventive concept.

Unless otherwise defined, all technical and scientific terms used herein have the same meaning as commonly understood by one of ordinary skill in the art to which the present application belongs. In the case of any inconsistencies, the present disclosure, including any definitions therein will prevail.

Methods and materials similar or equivalent to those described herein may be used in implementation or experiments of the present disclosure, but appropriate methods and materials are described in this specification.

The term "comprise(s)" and/or "comprising," or "include(s)" and/or "including" as used herein, unless otherwise specified, does not preclude the presence or addition of one or more other elements.

As used herein, the term "and/or" includes any and all combinations of one or more of the associated listed items. The term "or" as used herein means "and/or". Expressions such as "at least one of," or "one or more: as used herein, when preceding a list of elements, modify the entire list of elements and do not modify the individual elements of the list.

The term "polyimide-based substrate" is used herein to include "polyimide substrate" and "polyimide-containing derivative substrate".

Throughout the specification, it is to be understood that when one component is referred to as being "on" another component, the component may be directly on the other component or intervening components may be present between the component and the other component. Meanwhile, when one element is described as being placed "directly on" another element, there may be no other elements disposed therebetween.

Among electronic devices, an antenna element is commonly manufactured by laminating onto a substrate, a metal layer e.g., a copper foil, through which electric current by wireless signals flows.

Losses associated with signal reception of antennas include a loss due to permittivity of the substrate and a signal loss from a physical cause due to electrical resistance generated when wireless signals, e.g., electrical signals, flow within a metal layer. Wireless signals having a high frequency band, compared to wireless signals having a relatively low frequency band, tend to cause a phenomenon where an electric current generated by the wireless signals is further focused on the surface of the metal layer. In addition, a laminate-type copper-clad laminate film tends to crack on its surface due to a physical stress generated in a copper foil in curved areas of an antenna element. This may result in transmission loss. To address such issues, the method of coating the substrate surface with a material that improves dielectric characteristics is employed. However, this method may give rise to issues such as decrease in coatability of the substrate surface, and decrease in adhesion between the substrate and the copper foil.

In this context, the present inventors propose a copper-clad laminate film as follows.

A copper-clad laminate film according to an embodiment may include a fluorine-containing substrate; a tie layer disposed on the fluorine-containing substrate; and a copper layer disposed on the tie layer, wherein the tie layer may be a metal layer or metal alloy layer including a metal of a metal-oxygen (M-O) bond dissociation energy of 400 kJ/mol or more, and the tie layer may have a thickness of about 10 nm to about 100 nm.

As used herein, the term 'fluorine-containing substrate' refers to a substrate containing fluorine, and in particular, a substrate containing a resin containing fluorine atoms. Here, the fluorine-containing substrate may be a substrate that is itself a resin containing fluorine atoms, or contains a resin containing fluorine atoms along with another resin inside the substrate, or a resin surface-treated or coated with a fluorine atom-containing resin on the substrate surface. Examples of such cases where a fluorine atom-containing resin is contained along with another resin inside the substrate may be when a substrate can be formed by mixing a fluorine atom-containing resin with polyimide resin, or when a fluorine atom-containing resin is coated on surfaces of organic or inorganic particles included in the substrate, or when including a fluorine atom-containing resin mixed within organic or inorganic particles. Examples of the substrate formed by surface-treating or coating a substrate surface with a fluorine atom-containing resin may include a substrate of which one side or both sides are partially or completely surface-treated or coated with a fluorine atom-containing resin. The copper layer may consist of layers including a copper seed layer and a copper plating layer that are sequentially placed.

The copper-clad laminate film may have improved dielectric characteristics at high frequencies, and excellent coatability on the substrate surface and room-temperature and high-temperature adhesion between a fluorine-containing substrate and a copper seed layer and a copper plating layer.

Figure 2:
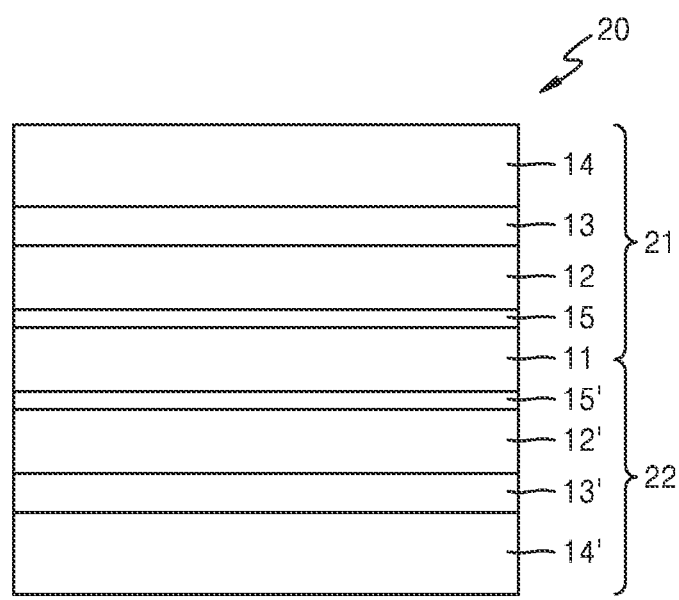
FIG. 2 is a cross-sectional schematic diagram of a double-sided copper-clad laminate film according to another embodiment.

FIG. 1 is a cross-sectional schematic diagram of a copper-clad laminate film 10 according to an embodiment. FIG. 2 is a cross-sectional schematic diagram of a double-sided copper-clad laminate film 20 according to an embodiment.

Referring to FIG. 1, the copper-clad laminate film 10 according to an embodiment may have sequentially disposed a polyimide-based substrate 1 having a fluorine layer 5 disposed thereon as a fluorine-containing substrate, a tie layer 2 on an upper side of the polyimide-based substrate 1 having the fluorine layer 5 placed thereon, a copper seed layer 3, and a copper plating layer 4. Referring to FIG. 2, the copper-clad laminate film 20 according to another embodiment is configured to include a polyimide-based substrate 11 having a fluorine layer 15 placed thereon as a fluorine-containing substrate; a first side 21 on which a tie layer 12, a copper seed layer 13, and a copper plating layer 14 are sequentially placed on an upper surface of the polyimide-based substrate 11 having the fluorine layer 15 placed thereon as a fluorine-containing substrate; and a second side 22 on which a tie layer 12', a copper seed layer 13', and a copper plating layer 14' are sequentially placed on a lower surface of the polyimide-based substrate 11 having a fluorine layer 15' placed thereon as a fluorine-containing substrate.

Hereinbelow, constituent components of the copper-clad laminate film 10, 20, namely, the polyimide-based substrate 1, 11 having the fluorine layer 5, 15, 15' placed thereon as a fluorine-containing substrate, the tie layer 2, 12, 12', the copper seed layer 3, 13, 13', and the copper plating layer 4, 14, 14' will be described.

<Polyimide-Based Substrate 1, 11 Having Fluorine Layer 5, 15, 15' Disposed Thereon as Fluorine-Containing Substrate>

A fluorine-containing substrate of a copper-clad laminate film 10 according to an embodiment may be a polyimide-based substrate 1, 11 having a fluorine layer 5, 15, 15' disposed thereon.

The polyimide-based substrate 1, 11 may be a modified PI (m-PI) substrate. The modified-PI substrate may be a resin substrate having a reduced amount of substituents with large polarity. Flowing of wireless signals through a circuit causes a change in an electric field around the circuit. Such changes in the electric field give rise to a lag in electric displacement towards the relaxation time of polarization inside a resin substrate. Here, heat is generated from friction between molecules inside the resin substrate, and this generated heat affects dielectric characteristics. Therefore, a modified-polyimide substrate having a reduced amount of substituents with large polarity may be used as the substrate.

The fluorine layer 5, 15, 15' may be placed on one side or both sides of the polyimide-based substrate 1, 11. The fluorine layer 5, 15, 15' may include one or more fluoropolymers selected from among polytetrafluoroethylene (PTFE), perfluoroalkoxy (PFA), fluorinated ethylenepropylene (FEP), chlorotrifluoroethylene (CTFE), tetrafluoroethylene/chlorotrifluoroethylene (TFE/CTFE), ethylenechlorotrifluoroethylene (ECTFE), and polyvinylidene fluoride (PVDF). For example, the fluorine layer 5, 15, 15' may be perfluoroalkoxy (PFA).

The thickness of the polyimide-based substrate 1, 11 on which the fluorine layer 5, 15, 15' is placed may be about 25 μm to about 100 μm. For example, the thickness of the polyimide-based substrate 1, 11 on which the fluorine layer 5, 15, 15' is placed thereon may be about 25 μm to about 90 μm, about 25 μm to about 80 μm, about 25 μm to about 70 μm, about 25 μm to about 60 μm, and about 25 μm to about 50 μm. The thickness of the fluorine layer 5, 15, 15' may be 50% or less with respect to 100% of the thickness of the polyimide-based substrate 1, 11 on which the fluorine layer 5, 15, 15' is placed thereon. When the thickness of the polyimide-based substrate 1, 11 on which the fluorine layer 5, 15, 15' is placed is less than 25 μm, productivity of manufacturing of the copper-clad laminate film 10, 20 may decrease, whereas when the thickness of the polyimide-based substrate 1, 11 on which the fluorine layer 5, 15, 15' is placed exceeds 100 μm, it may be difficult to realize a thin film.

Water contact angle with respect to the polyimide-based substrate 1, 11 having the fluorine layer 5, 15, 15' disposed thereon may be 120° or less. For example, the water contact angle with respect to the polyimide-based substrate 1, 11 having the fluorine layer 5, 15, 15' disposed thereon may be about 107° to about 120°.

Diiodomethane contact angle with respect to the polyimide-based substrate 1, 11 having the fluorine layer 5, 15, 15' disposed thereon may be 90° or less. For example, the diiodomethane contact angle with respect to the polyimide-based substrate 1, 11 having the fluorine layer 5, 15, 15' disposed thereon may be about 77° to about 90°.

The polyimide-based substrate 1, 11 having the fluorine layer 5, 15, 15' disposed thereon may have a surface energy of about 11 dyne/cm to about 25 dyne/cm.

When the water contact angle, diiodomethane contact angle, and surface energy with respect to the polyimide-based substrate 1, 11 having the fluorine layer 5, 15, 15' disposed thereon are within the above ranges, an appropriate coatability may be ensured such that a thickness variation of the fluorine layer 5, 15, 15' disposed on both sides of the polyimide-based substrate 1, 11 may be ±10% or less, thus preventing curling. As a result, stable formation of a copper seed layer 3, 13, 13' and a copper plating layer 4, 14, 14' on the surface of the polyimide-based substrate 1, 11 may be possible.

The fluorine content of the surface of the polyimide-based substrate 1, 11 having the fluorine layer 5, 15, 15' placed thereon may be about 60 atom % to about 75 atom %. The polyimide-based substrate 1, 11 having the fluorine layer 5, 15, 15' placed thereon having a fluorine content within such ranges may achieve low permittivity, low dielectric loss, and low transmission loss. The polyimide-based substrate 1, 11 having the fluorine layer 5, 15, 15' placed thereon may have, at a frequency of 20 GHz, a permittivity ($D_k$) of 2.8 or less and a dielectric loss ($D_f$) of 0.003 or less. For example, the polyimide-based substrate 1, 11 having the fluorine layer 5, 15, 15' placed thereon may have, at a frequency of 20 GHz, a permittivity ($D_k$) of about 0.01 to about 2.8 and a dielectric loss ($D_f$) of about 0.00001 to about 0.003.

The coefficient of thermal expansion (CTE) of the polyimide-based substrate 1, 11 having the fluorine layer 5, 15, 15' placed thereon may be 25 ppm/° C. or less. For example, the coefficient of thermal expansion (CTE) of the polyimide-based substrate 1, 11 having the fluorine layer 5, 15, 15' placed thereon may be about 0.01 ppm/° C. to about 25 ppm/° C. When used to manufacture the copper-clad laminate film 10, 20 with a copper foil including the copper seed layer 3, 13, 13' and the copper plating layer 4, 14, 14', the polyimide-based substrate 1, 11 having the fluorine layer 5, 15, 15' with such a coefficient of thermal expansion (CTE) has not big a difference in terms of CTE compared to the CTE (16-20 ppm) of a copper layer consisting of the copper seed layer 3, 13, 13' and the copper plating layer 4, 14, 14', thus causing a low amount of residual stress, and as a result, no bending, warpage due to shrinkage, and bending issues occur.

When necessary, prior to placing a tie layer 2, 12, 12' described below, a surface treatment of the polyimide-based substrate 1, 11 having the fluorine layer 5, 15, 15' placed thereon may be performed by irradiating an ion beam of an ionized reaction gas on top of the polyimide-based substrate 1, 11 having the fluorine layer 5, 15, 15' placed thereon. As a result, as functional groups, such as —OH, —CHO, and —COOH, are formed on the surface of the fluorine layer 5, 15, 15', it is possible to provide the copper-clad laminate film 10, 20 with excellent adhesion between the polyimide-based substrate 1, 11 and the copper seed layer 3, 13, 13' and the copper plating layer 4, 14, 14' described below.

The surface treatment using the ion beam may utilize a reaction gas including one or more selected from among nitrogen ($N_2$), oxygen ($O_2$), argon (Ar), xenon (Xe), and helium (He). For example, the reaction gas may be composed of oxygen ($O_2$) alone or may be a mixture gas of argon-oxygen (Ar—$O_2$) or argon-nitrogen (Ar—$N_2$). In this case, a dramatic increase may be possible in terms of adhesion of the polyimide-based substrate 1, 11 having the fluorine layer 5, 15, 15' placed thereon, with a copper seed layer 3, 13, 13' and a copper plating layer 4, 14, 14' described below, even at room temperature and high temperatures.

In addition, when using argon (Ar) in a mixture as the reaction gas, the argon (Ar) may be included in an amount of about 0.1 vol % to about 50 vol %, or about 0.1 vol % to about 30 vol %, or about 0.1 vol % to about 25 vol % with respect to the total volume of the reaction gas. Use of argon (Ar) in a mixture within such ranges may drastically improve, even at room temperature and high temperatures, adhesion between the polyimide-based substrate 1, 11 having the fluorine layer 5, 15, 15' placed thereon, and the copper seed layer 3, 13, 13' and the copper plating layer 4, 14, 14' described below.

For example, a flow rate of the reaction gas may be about 1 sccm to about 100 sccm (standard cubic centimeter per minute), about 50 sccm to about 100 sccm, or about 60 sccm to about 80 sccm. By having the flow rate in such ranges, stable irradiation of an ion beam may be achieved on a surface of the polyimide-based substrate 1, 11 having the fluorine layer 5, 15, 15' placed thereon.

An irradiation dose of the ion beam may be, without being limited to, about $1 \times 10$ ions/cm$^2$ to about $1 \times 10^{17}$ ions/cm$^2$. In this range, the effect of ion beam irradiation may be maximized on the surface of the polyimide layer.

In addition, the irradiation time of the ion beam is not limited and may be appropriately adjusted according to an intended purpose.

A roll-to-roll process may be employed as a method by which the ion beam is irradiated. For example, the roll-to-roll process may be performed by irradiating the ion beam in an MD (machine direction) direction for about 1 second to about 50 seconds, to the surface of the polyimide-based substrate 1, 11 having placed thereon the fluorine layer 5, 15, 15' that is continuously supplied at 2 to 10 mpm (meters per minute). Within the above range, the copper-clad laminate film 10, 20 may have excellent efficiency and excellent adhesion at room temperature and adhesion at high temperature between the polyimide-based substrate 1, 11 and the copper seed layer 3, 13, 13' and the copper plating layer 4, 14, 14' described below.

Power to apply the ion beam may be from about 0.1 kW to about 5 kW, about 0.1 kW to about 3 kW, or about 0.5 kW to about 2 kW. Within such ranges, adhesion of the copper seed layer 3, 13, 13' and the copper plating layer 4, 14, 14' with the polyimide-based substrate 1, 11 having the fluorine layer 5, 15, 15' placed thereon may drastically increase even at room temperature and high temperature.

<Tie Layer 2, 12, 12'>

On a polyimide-based substrate 1, 11 having a fluorine layer 5, 15, 15' positioned thereon, a tie layer 2, 12, 12' may be positioned. The tie layer 2, 12, 12' may include at least one metal element selected from among metal elements of Group 4, 6, 13, and 14 in the Periodic Table. The tie layer 2, 12, 12' may include at least one metal or alloy selected from among metal elements of Groups 4, 6, 13, and 14 in the Periodic Table.

The tie layer 2, 12, 12' may be a metal layer or a metal alloy layer, including a metal having a metal-oxygen (M-O) bond dissociation energy of 400 kJ/mol or more. A metal element having the above M-O bond dissociation energy forms a relatively stable bond with oxygen. As a result, adhesion may be improved by ensuring a stable metal oxide or alloy oxide on the interface of the tie layer 2, 12, 12' and the fluorine layer 5, 15, 15', and transmission loss may be minimized by applying the tie layer 2, 12, 12' having high electrical conductivity.

The tie layer 2, 12, 12' may include one or more metal or metal alloy selected from among W, Ti, Sn, Cr, Al, and Mo. The metal or metal alloy forms a relatively stable bond with oxygen, and since compared to a metal tie layer containing Ni alone exhibiting strong ferromagnetism, a lower transmission loss may be achieved, and therefore, electrical conductivity on the surface of the tie layer 2, 12, 12' may be improved.

The tie layer 2, 12, 12' may further include Ni, and the content of the Ni may be 50 wt % or less. The tie layer 2, 12, 12' may form an alloy of Ni with a metal selected from among W, Ti, Sn, Cr, Al, and Mo, and the content of Ni in the alloy may be 50 wt % or less. The content of Ni exceeding 50 wt % may cause a high transmission loss and may cause a decrease in room-temperature adhesion and high-temperature adhesion between the polyimide-based substrate 1, 11 having the fluorine layer 5, 15, 15' placed thereon and the copper seed layer 3, 13, 13' and the copper plating layer 4, 14, 14'.

The tie layer 2, 12, 12' may have a thickness of about 10 nm to about 100 nm. For example, the thickness of the tie layer 2, 12, 12' may be about 12 nm to about 50 nm, or about 12 nm to about 40 nm. When the thickness of the tie layer 2, 12, 12' is less than 10 nm, the thickness may be too small to form a sufficient metal oxide or alloy oxide at an interface with the substrate, and as a result, it may be difficult to ensure adhesion at room temperature and high temperature. If the tie layer 2, 12, 12' has a thickness of more than 100 nm, it may cause the tie layer 2, 12, 12' to be unsuccessfully etched during the etching process for circuit formation and thus remain to cause circuit defects and decrease room-temperature adhesion.

<Copper Seed Layer 3, 13, 13' and Copper Plating Layer 4, 14, 14'>

The copper seed layer 3, 13, 13' may be placed on the tie layer 2, 12, 12'. The copper seed layer 3, 13, 13' may be a sputtered layer. The sputtered copper seed layer may provide a low transmission loss, while maintaining an inherent surface roughness of the polyimide-based substrate 1, 11 having the fluorine layer 5, 15, 15' placed thereon. For the sputtering method, methods such as physical vapor deposition (PVD), chemical vapor deposition (CVD), low pressure chemical vapor deposition (LPCVD) may be used but are not limited thereto, and any and/or all sputtering methods available in the art may be used. For example, a PVD method may be used as the sputtering method.

The copper seed layer 3, 13, 13' may have a thickness of about 800 Å to about 4,000 Å. For example, the copper seed layer 3, 13, 13' may have a thickness of about 850 Å to about 3,500 Å, about 900 Å to about 3,000 Å, about 950 Å to about 2,500 Å, about 1,000 Å to about 2,000 Å, or about 1,000 Å to about 1,500 Å. When the copper seed layer 3, 13, 13' has a thickness in the above ranges, it is possible to ensure conductivity during film formation and provide a copper clad laminate film 10, 20 that has a low transmission loss with a low surface roughness ($R_z$).

A copper plating layer 4, 14, 14' may be positioned on the copper seed layer 3, 13, 13'. The copper plating layer 4, 14, 14' may be formed by methods, such as an electroless plating method and an electroplating method. For example, the copper plating layer 4, 14, 14' may be formed using an electroplating method.

The copper electroplating layer may be formed by any method available in the art. For example, by performing electroplating using an electroplating solution based on copper sulfate and sulfuric acid, a copper electroplating layer may be formed on one side of the copper seed layer 3, 13, 13'. In addition, the electroplating solution may further contain additives such as a brightener, a leveller, a corrective agent r, amitigator, and the like, to improve productivity and surface uniformity.

The copper plating layer 4, 14, 14' may have a thickness of 12 μm or less. For example, the copper plating layer 4, 14, 14' may have a thickness of about 0.1 μm to about 12.0 μm, about 1.0 μm to about 12.0 μm, about 2.0 μm to about 12.0 μm, about 4.0 μm to about 12.0 μm, or about 6.0 μm to about 12.0 μm.

<Copper-Clad Laminate Film 10, 20>

A copper-clad laminate film 10, 20 according to an embodiment may include a polyimide-based substrate 1, 11 having a fluorine layer 5, 15, 15' disposed thereon as a fluorine-containing substrate, and on the polyimide-based substrate 1, 11 having the fluorine layer 5, 15, 15' disposed thereon, a tie layer 2, 12, 12' which is a metal layer or a metal alloy layer including a metal having a metal-oxygen (M-O) bond dissociation energy of 400 kJ/mol or more, wherein the tie layer 2, 12, 12' may have a thickness of about 10 nm to about 100 nm. The copper-clad laminate film 10, 20 may have improved dielectric characteristics at high frequencies, and excellent coatability on the substrate surface and adhesion between the substrate and a copper foil at room temperature and high temperature.

In a copper-clad laminate film 10, 20 according to an embodiment, the copper seed layer and the copper plating layer may have a peel strength of 0.65 kgf/cm or more, as measured after being left at room temperature (25° C.) for 3 days, with respect to the polyimide-based substrate having the fluorine layer disposed thereon.

In a copper-clad laminate film 10, 20 according to an embodiment, a peel strength of the copper seed layer and the copper plating layer with respect to the polyimide-based substrate having the fluorine layer disposed thereon, as measured after two or more heat-treatments at 150° C. or higher and being left for 1 day, may be 0.35 kgf/cm or more. For example, in the copper-clad laminate film 10, 20, the copper seed layer and the copper plating layer may have a peel strength of 0.35 kgf/cm or more, with respect to the polyimide-based substrate having the fluorine layer disposed thereon, as measured after a first heat-treatment at 150° C. for 2 hours, being left at room temperature for 30 minutes, a second heat-treatment at 150° C. for 2 hours and a third heat-treatment at 240° C. for 10 minutes, and then being left alone at room temperature (25° C.) for 1 day.

<Electronic Device>

An electronic device according to another embodiment may include the copper clad laminate film 10, 20.

The electronic device may include an antenna device or an antenna cable. For example, the antenna device may be an antenna device for a mobile phone or display. In addition, the electronic device may include circuit boards such as an USB, a radar, an IOT (Internet of Things) appliance for 5G, a network server, and the like.

Hereinbelow, the present disclosure will be described in greater detail with reference to the examples and comparative examples. However, the following examples are provided only to illustrate the present inventive concept, and it will become apparent that these examples are not intended to limit the scope of the present inventive concept.

EXAMPLES

Example 1: Copper-Clad Laminate Film

A copper clad laminate film 20 as shown in FIG. 2 was prepared as follows.

Prepared as a substrate was a polyimide film 11 (manufactured by PI Advanced Materials, total thickness: 50 μm, and at 20 GHz, permittivity ($D_k$): 2.8, dielectric loss ($D_f$): 0.003, CTE: 25 ppm/° C.) which has a fluorine coating layer 15, 15' of a thickness of about 12.5 μm placed on each side thereof. Using an ion beam source in a roll-to-roll type sputtering device, an ion beam treatment was performed on the first side 21 of the polyimide film 11 that has the fluorine coating layer 15 placed thereon. The ion beam treatment was performed while supplying the inert gas Ar at a flow rate of 30 sccm under a pressure of $10^{-6}$ Torr at an applied power of 1.0 kV. Then, on an upper surface of the ion beam-treated fluorine coating layer 15, a tie layer 12 was formed to a thickness of about 20 nm by PVD, using molybdenum (purity: 99.995%) (Mo, Mo—O bond dissociation energy: 400 kJ/mol). Then, on an upper surface of the tie layer 12, a copper seed layer 13 was formed to a thickness of about 100 nm by PVD using copper (purity: 99.995%). Then, following the same process as described above, a second surface 22 of the polyimide film 11 that has a fluorine coating layer 15' placed thereon was treated with an ion beam, and a tie layer 12' and a copper seed layer 13' were formed thereon. Next, the copper plating layer having a thickness of about 12 μm was formed on each copper seed layer 13, 13' by copper electroplating. For an electrolytic copper plating solution used in the copper electroplating, a solution having a $Cu^{2+}$ concentration of 28 g/L and sulfuric acid of 195 g/L, and further containing 0.01 g/L of 3—N, N-dimethylaminodithiocarbamoyl-1-propane sulfonic acid as a brightener and a corrective agent (Atotech), was used. The copper electroplating was performed at 34° C. while gradually increasing a current density from 1.0 A/dm² up to 2.86 A/dm² in a step-wise manner.

Example 2: Copper-Clad Laminate Film

A copper-clad laminate film was prepared following the same method as described in Example 1, except that on an upper surface of the ion beam-treated fluorine coating layer 15, the tie layer 12 was formed by PVD to a thickness of about 12 nm using copper of 99.995% purity (Mo, Mo—O bond dissociation energy: 400 kJ/mol).

Example 3: Copper-Clad Laminate Film

A copper-clad laminate film was prepared following the same method as described in Example 1, except that on an upper surface of the ion beam-treated fluorine coating layer 15, the tie layer 12 was formed by PVD to a thickness of about 25 nm using copper of 99.995% purity (Mo, Mo—O bond dissociation energy: 400 kJ/mol).

Example 4: Copper-Clad Laminate Film

A copper-clad laminate film was prepared following the same method as described in Example 1, except that on an upper surface of the ion beam-treated fluorine coating layer 15, the tie layer 12 was formed by PVD to a thickness of about 40 nm using copper of 99.995% purity (Mo, Mo—O bond dissociation energy: 400 kJ/mol).

Example 5: Copper-Clad Laminate Film

A copper-clad laminate film (20) was prepared following the same method as in Example 1, except that on the upper surface of the ion beam-treated fluorine coating layer 15, the tie layer 12 was formed to a thickness of about 20 nm by PVD using molybdenum (Mo, Mo—O bond dissociation energy: 400 kJ/mol) and nickel (Ni, Ni—O bond dissociation energy: 360 kJ/mol) in a weight ratio of 70:30 (purity: 99.9% or higher).

Example 6: Copper-Clad Laminate Film

A copper-clad laminate film 20 was prepared following the same method as in Example 1, except that on the upper surface of the ion beam-treated fluorine coating layer 15, the tie layer 12 was formed to a thickness of about 20 nm by PVD using tungsten (W, W—O bond dissociation energy: 710 kJ/mol) and titanium (Ti, Ti—O bond dissociation energy: 670 kJ/mol) in a weight ratio of 90:10 (purity: 99.9% or higher).

Example 7: Copper-Clad Laminate Film

A copper-clad laminate film 20 was prepared following the same method as in Example 1, except that on the upper surface of the ion beam-treated fluorine coating layer 15, the tie layer 12 was formed to a thickness of about 20 nm by PVD using molybdenum (Mo, Mo—O bond dissociation energy: 400 kJ/mol) and titanium (Ti, Ti—O bond dissociation energy: 670 kJ/mol) in a weight ratio of 50:50 (purity: 99.9% or higher).

Example 8: Copper-Clad Laminate Film

A copper-clad laminate film 20 was prepared following the same method as in Example 5, except that when performing the ion beam treatment using a roll-to-roll type sputtering device on the first surface 21 on the polyimide film 11 having the fluorine coating layer 15 disposed thereon, the ion beam treatment was performed at a pressure of $10^{-6}$ Torr and an applied power of 1.0 kV while injecting reaction gases Ar and $O_2$ in a flow rate (sccm) ratio of 30:9.

Example 9: Copper-Clad Laminate Film

A copper-clad laminate film 20 was prepared following the same method as in Example 5, except that when performing the ion beam treatment using a roll-to-roll type sputtering device on the first surface 21 on the polyimide film 11 having the fluorine coating layer 15 disposed thereon, the ion beam treatment was performed at a pressure of $10^{-6}$ Torr and an applied power of 1.0 kV while injecting reaction gases Ar and $N_2$ in a flow rate (sccm) ratio of 30:9.

Example 10: Copper-Clad Laminate Film

A copper-clad laminate film 20 was prepared following the same method as described in Example 3, except that when performing the ion beam treatment on the first side 21 of the polyimide film 11 having the fluorine coating layer 15 placed thereon by using a roll-to-roll type sputtering device, the ion beam treatment was performed while supplying reaction gas $O_2$ at a flow rate of 9 sccm under a pressure of $10^{-6}$ Torr and at an applied power of 1.0 kV.

Example 11: Copper-Clad Laminate Film

A copper-clad laminate film 20 was prepared following the same method as described in Example 3, except that when performing the ion beam treatment on the first side 21 of the polyimide film 11 having the fluorine coating layer 15 placed thereon by using a roll-to-roll type sputtering device, the ion beam treatment was performed while supplying reaction gas $N_2$ at a flow rate of 9 sccm under a pressure of $10^{-6}$ Torr and at an applied power of 1.0 kV.

Comparative Example 1: Copper-Clad Laminate Film

A copper-clad laminate film 20 was prepared following the same method as described in Example 1, except that on the upper surface of the ion beam-treated fluorine coating layer 15, the tie layer 12 was formed by physical vapor deposition (PVD) to a thickness of about 20 nm using nickel of 99.995% purity (Ni, Ni—O bond dissociation energy: 360 kJ/mol).

Comparative Example 2: Copper-Clad Laminate Film

A copper-clad laminate film 20 was prepared following the same method as in Example 1, except that on the upper surface of the ion beam-treated fluorine coating layer 15, the tie layer 12 was formed to a thickness of about 20 nm by PVD using nickel (Ni, Ni—O bond dissociation energy: 360 kJ/mol) and chromium (Cr, Cr—O bond dissociation energy: 480 kJ/mol) in a weight ratio of 80:20 (purity: 99.9% or higher).

Comparative Example 3: Copper-Clad Laminate Film

A copper-clad laminate film 20 was prepared following the same method as in Example 1, except that on the upper surface of the ion beam-treated fluorine coating layer 15, the tie layer 12 was formed to a thickness of about 20 nm by PVD using nickel (Ni, Ni—O bond dissociation energy: 360 kJ/mol) and copper (Co, Co—O bond dissociation energy: 280 kJ/mol) in a weight ratio of 65:35 (purity: 99.9% or higher).

Comparative Example 4: Copper-Clad Laminate Film

A copper-clad laminate film 20 was prepared following the same method as in Example 1, except that on the upper surface of the ion beam-treated fluorine coating layer 15, the tie layer 12 was formed to a thickness of about 20 nm by PVD using molybdenum (Mo, Mo—O bond dissociation energy: 400 kJ/mol) and nickel (Ni, Ni—O bond dissociation energy: 360 kJ/mol) in a weight ratio of 30:70 (purity: 99.9% or higher).

Comparative Example 5: Copper-Clad Laminate Film

A copper-clad laminate film was prepared following the same method as described in Example 1, except that on an upper surface of the ion beam-treated fluorine coating layer 15, the tie layer 12 was formed by PVD to a thickness of about 8 nm using copper of 99.995% purity (Mo, Mo—O bond dissociation energy: 400 kJ/mol).

Comparative Example 6: Copper-Clad Laminate Film

A copper-clad laminate film was prepared following the same process described in Example 3, except that the second side 22 and the first side 21 of the polyimide film 11 with the fluorine coating layer 15 placed thereon were not ion beam-treated.

Evaluation Example 1: Evaluation of Physical Properties

Physical properties of the copper-clad laminate films prepared in Examples 1-11 and Comparative Examples 1-6 were evaluated by the measurement methods below. The results thereof are shown in Table 1.
(1) Water Contact Angle (Deg), Diiodomethane Contact Angle (Deg.), and Surface Energy (Dyne/Cm) of Substrate Surface On the surface of the polyimide film substrate having the fluorine coating layer disposed thereon of the copper-clad laminate films prepared in Example 5, Examples 8 to 11, and Comparative Example 6, 10 drops of deionized water and diiodomethane were applied under an atmosphere of 50 RH % at 25° C., and then, using a contact angle meter (Drop Master 300, Kyowa Interface Science Co., Ltd.), the average value of each of water contact angle and diiodomethane contact angle was measured. Then, surface energies were obtained by using the values of the contact angles according to the Owens-Wendt-Rabel-Kaelble method.

(2) Fluorine Content on Substrate Surface—XPS Analysis

X-ray photoelectron spectroscopy (XPS) analysis was performed on the polyimide film surface having an ion beam-surface treated fluorine coating layer disposed thereon, or the polyimide film surface having a fluorine coating layer untreated with an ion beam disposed thereon, of the copper-clad laminate films prepared in Example 5, Example 10, Example 11, and Comparative Example 6. The XPS analysis was performed using the K-Alpha system by Thermo Fisher Scientific.

(3) Room-Temperature Adhesion (Kgf/Cm)

The copper-clad laminate films prepared in Examples 1 to 7 and Comparative Examples 1 to 5 were cut to a predetermined size to produce samples. After forming a circuit pattern having a width of 3 mm on the sample surface, the entire surface of the other surface of the surface having the circuit pattern formed thereon was etched. Then, the sample was left at room temperature (25° C.) for 3 days and then, using a peel strength testing device (manufactured by Shimazu, AG-50NIS), was peeled at an elongation rate of 50 mm/min and at an angle of 180°, to measure the peel strength of the copper seed layer and the copper plating layer with respect to the polyimide film having the fluorine coating layer disposed thereon.

(3) High-Temperature Adhesion (Kgf/Cm)

The copper-clad laminate films prepared in Examples 1 to 7 and Comparative Examples 1 to 5 were cut to a predetermined size to produce samples. After forming a circuit pattern having a width of 3 mm on the sample surface, the entire surface of the other surface of the surface having the circuit pattern formed thereon was etched. Thereafter, the sample was subjected to a first heat-treatment at 150° C. for 2 hours and then allowed to stand at room temperature for 30 minutes. Then, the sample was subjected to a second heat-treatment at 150° C. for 2 hours, and a third heat-treatment at 240° C. for 10 minutes. Finally, the sample was left at room temperature (25° C.) for 1 day and then, using a peel strength testing device (manufactured by Shimazu, AG-50NIS), was peeled at an elongation rate of 50 mm/min and at an angle of 180°, to measure the peel strength of the copper seed layer and the copper plating layer with respect to the polyimide film having the fluorine coating layer disposed thereon.

TABLE 1

| Item | Water contact angle (deg) | Diiodomethane contact angle (deg) | Surface energy (dyne/cm) | Fluorine content (atom %) | Adhesive strength (kgf/cm) | |
|---|---|---|---|---|---|---|
| | | | | | Room temperature | High temperature |
| Example 1 | — | — | — | | 0.7 | 0.35 |
| Example 2 | — | — | — | | 0.75 | 0.15 |
| Example 3 | — | — | — | | 0.71 | 0.20 |
| Example 4 | — | — | — | | 0.80 | 0.23 |
| Example 5 | 108.7 | 77.7 | 18.8 | 73.82 | 0.69 | 0.37 |
| Example 6 | — | — | — | — | 0.77 | 0.64 |
| Example 7 | — | — | — | — | 0.68 | 0.54 |
| Example 8 | 107.3 | 82.0 | 16.5 | — | — | — |
| Example 9 | 110.8 | 79.6 | 17.9 | — | — | — |
| Example 10 | 108.6 | 84.5 | 14.4 | 65.13 | — | — |
| Example 11 | 109.2 | 79.5 | 14.8 | 64.92 | — | — |
| Comparative Example 1 | — | — | — | — | 0.48 | 0.46 |
| Comparative Example 2 | — | — | — | — | 0.58 | 0.52 |
| Comparative Example 3 | — | — | — | — | 0.55 | 0.5 |
| Comparative Example 4 | — | — | — | — | 0.47 | 0.38 |
| Comparative Example 5 | — | — | — | — | 0.63 | 0.22 |
| Comparative Example 6 | 118.2 | 94.3 | 10.9 | 68.42 | — | — |

As shown in Table 1, water contact angle and diiodomethane contact angle with respect to the copper-clad laminate films prepared in Example 5 and Example 8 to Example 11 were 107.3°-110.8° and 77.7°-84.5°, which were lower than that of the copper-clad laminate film prepared in Comparative Example 6. The substrate surface of the copper-clad laminate films prepared in Example 5 and Examples 8 to 11 had a surface energy of 14.4 dyne/cm to 18.8 dyne/cm, which was higher than that of the substrate surface of the copper-clad laminate film prepared in Comparative Example 6. The copper-clad laminate films prepared in Examples 1 to 7 had a fluorine content of about 64.92 atom % to about 73.82 atom % on the substrate surface thereof.

This shows that the tie layer, the copper seed layer, and the copper plating layer were stably formed on the substrate through ensuring an appropriate coatability with respect to the substrate surface of the copper-clad laminate films prepared in Example 5 and Examples 8 to 11.

The copper-clad laminate films prepared in Examples 1 to 7 had a room-temperature adhesion of 0.68 kgf/cm or more, which was higher than that of the copper-clad laminate films prepared in Comparative Examples 1 to 5. The copper-clad laminate films prepared in Examples 1 and Examples 5 to 7 had a high-temperature adhesion of 0.35 kgf/cm or more, which was higher than that of the copper-clad laminate film prepared in Comparative Example 5.

The copper-clad laminate films prepared in Examples 1 to 7 include a tie layer consisting of a metal layer or a metal alloy layer, including a metal that has a metal-oxygen (M-O) bond dissociation energy of 400 kJ/mol or more, wherein the tie layer has a thickness of about 10 nm to about 50 nm. Accordingly, it could be confirmed that room-temperature adhesion was improved as the tie layer reacted with functional groups on the surface of the polyimide substrate film having the fluorine coating layer disposed thereon. In addition, it could be confirmed that the copper-clad laminate films prepared in Example 1 and Examples 5 to 7 had improved high-temperature adhesion for the same reason. Thus, it could be confirmed that the copper-clad laminate films prepared in Examples 1 to 7 may be applicable to the inside and/or outside of electronic devices such as miniaturized 5G mobile communication devices.

A copper-clad laminate film according to an aspect may include a fluorine-containing substrate; a tie layer disposed on the fluorine-containing substrate; and a copper layer disposed on the tie layer. The tie layer may be a metal layer or a metal alloy layer including a metal having a metal-oxygen (M-O) bond dissociation energy of 400 kJ/mol or more, and the tie layer may have a thickness of about 10 nm to about 100 nm. The copper-clad laminate film may have improved dielectric characteristics at high frequencies, and excellent coatability on the substrate surface and adhesion between the substrate and a copper foil at room temperature and high temperature.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A copper-clad laminate film, comprising:
   a fluorine-containing substrate;
   a tie layer disposed on the fluorine-containing substrate; and
   a copper layer positioned on the tie layer,
   wherein the fluorine-containing substrate comprises a fluorine layer disposed on one side or both sides of a substrate,
   wherein the fluorine layer comprises one or more fluoropolymers,
   wherein the copper layer comprises a copper seed layer on the tie layer and a copper plating layer on the copper seed layer; and
   wherein the tie layer is a metal layer or a metal alloy layer, comprising a metal having a metal-oxygen (M-O) bond dissociation energy of 400 KJ/mol or more, the tie-layer has a thickness of about 10 nm to about 100 nm, and the metal consists of at least one metal element selected from among W, Ti, Sn, Al, and Mo, and further consists of Ni, and a content of the Ni is 50 wt % or less.

2. The copper-clad laminate film of claim 1, wherein the copper-clad laminate film has a water contact angle of 120° or less with respect to the fluorine-containing substrate.

3. The copper-clad laminate film of claim 1, wherein the copper-clad laminate film has a diiodomethane contact angle of 90° or less with respect to the fluorine-containing substrate.

4. The copper-clad laminate film of claim 1, wherein the fluorine-containing substrate has a surface energy of about 11 dyne/cm to about 25 dyne/cm.

5. The copper-clad laminate film of claim 1, wherein a fluorine content of a surface of the fluorine-containing substrate is about 60 atom % to about 75 atom %.

6. The copper-clad laminate film of claim 1, wherein the copper seed layer and the copper plating layer has a peel strength of 0.65 kgf/cm or more with respect to the fluorine-containing substrate, as measured after being left at room temperature (25° C.) for 3 days.

7. The copper-clad laminate film of claim 1, wherein the copper seed layer and the copper plating layer with respect to the fluorine-containing substrate has a peel strength of 0.35 kgf/cm or more as measured after two or more heat treatments at a temperature of 150° C. or higher and being left for 1 day.

8. The copper-clad laminate film of claim 1, wherein the copper plating layer has a thickness of 12 μm or less.

9. An electronic device comprising the copper-clad laminate film according to any one of claim 1.

10. The electronic device of claim 9, wherein the electronic device comprises an antenna element or an antenna cable.

\* \* \* \* \*